US010438867B2

(12) United States Patent
Christiansen et al.

(10) Patent No.: US 10,438,867 B2
(45) Date of Patent: Oct. 8, 2019

(54) IMMERSION COOLING TEMPERATURE CONTROL METHOD, SYSTEM, AND APPARATUS

(71) Applicants: Martin Brokner Christiansen, Laurel, MD (US); Leonard George Chorosinski, Ellicott City, MD (US); Harlan Craig Heffner, Ellicott City, MD (US); Stanley Katsuyoshi Wakamiya, Ellicott City, MD (US); Keith R. Kirkwood, Columbia, MD (US)

(72) Inventors: Martin Brokner Christiansen, Laurel, MD (US); Leonard George Chorosinski, Ellicott City, MD (US); Harlan Craig Heffner, Ellicott City, MD (US); Stanley Katsuyoshi Wakamiya, Ellicott City, MD (US); Keith R. Kirkwood, Columbia, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/916,019

(22) Filed: Mar. 8, 2018

(65) Prior Publication Data
US 2019/0279916 A1    Sep. 12, 2019

(51) Int. Cl.
*H01L 23/44* (2006.01)
*G06F 1/20* (2006.01)

(52) U.S. Cl.
CPC .............. *H01L 23/44* (2013.01); *G06F 1/206* (2013.01); *G06F 2200/201* (2013.01)

(58) Field of Classification Search
CPC .. H05K 3/368; H05K 7/20336; H05K 1/0203; H05K 1/0271; H05K 1/0201;
(Continued)

(56) References Cited

U.S. PATENT DOCUMENTS 4,865,331 A    9/1989  Porter
4,962,444 A    10/1990 Niggemann
(Continued)

FOREIGN PATENT DOCUMENTS

DE    10138711 A1    4/2002
EP    2400828 A1    12/2011
(Continued)

OTHER PUBLICATIONS

Canadian Office Action corresponding to Canadian Patent No. 3004084 dated Mar. 4, 2019.
(Continued)

*Primary Examiner* — Mandeep S Buttar
(74) *Attorney, Agent, or Firm* — Tarolli, Sundheim, Covell & Tummino LLP

(57) ABSTRACT

An apparatus for providing immersion cooling in a circuit card environment includes a circuit card having first and second longitudinally spaced circuit card subassemblies, connected together into a single circuit card oriented substantially in a lateral-longitudinal plane. The first and second circuit card subassemblies have first and second operating temperatures, respectively, which are different from one another. A thermal energy transfer device is operatively connected to an area of the circuit card correlated with a selected one of the first and second circuit card subassemblies. The thermal energy transfer device at least partially induces the respective one of the first and second operating temperatures to the selected circuit card subassembly. The thermal energy transfer device transversely overlies at least
(Continued)

a supermajority of the selected circuit card subassembly and is laterally spaced from the other circuit card subassembly. A system and method for providing immersion cooling are also provided.

17 Claims, 10 Drawing Sheets

(58) Field of Classification Search
CPC ............ H05K 1/0216; H05K 7/20563; H05K 7/20818; H05K 1/00; H05K 7/20309; F28D 15/00; G06F 1/20; G06F 2200/201
USPC ..... 361/676, 700, 749, 796, 679.47, 679.54, 361/699, 688, 702, 703, 709, 720, 728, 361/748, 801, 802; 165/104.26, 104.33, 165/104.21, 100; 257/E23.088
See application file for complete search history.

(56) References Cited

U.S. PATENT DOCUMENTS

| | | | |
|---|---|---|---|
| 5,329,428 A * | 7/1994 | Block | G02B 6/4292 361/785 |
| 6,616,469 B2 | 9/2003 | Goodwin et al. | |
| 8,780,556 B1 | 7/2014 | Ditri | |
| 9,648,749 B1 | 5/2017 | Christiansen | |
| 9,681,533 B2 | 6/2017 | Christiansen et al. | |
| 2002/0172007 A1* | 11/2002 | Pautsch | H01L 23/4735 361/690 |
| 2005/0061541 A1 | 3/2005 | Belady | |
| 2009/0323286 A1* | 12/2009 | Han | G06F 1/20 361/702 |
| 2013/0333414 A1 | 12/2013 | Inaba et al. | |
| 2014/0316614 A1 | 10/2014 | Newman | |
| 2015/0059388 A1* | 3/2015 | Hirano | H05K 7/20772 62/259.2 |
| 2016/0073548 A1 | 3/2016 | Wei et al. | |
| 2017/0142820 A1 | 5/2017 | Christiansen et al. | |
| 2018/0166621 A1* | 6/2018 | Ranalli | F25B 21/02 |

FOREIGN PATENT DOCUMENTS

| | | |
|---|---|---|
| EP | 3378291 A1 | 9/2018 |
| JP | 77188 A | 1/1995 |
| JP | 2007049015 A | 2/2007 |
| JP | 5149706 B2 | 12/2009 |
| JP | 2010186846 A | 8/2010 |
| JP | 2012509812 A | 4/2012 |
| WO | 2014130871 A1 | 8/2014 |
| WO | 2015014116 A1 | 5/2015 |
| WO | 2017087092 A1 | 2/2019 |

OTHER PUBLICATIONS

Japanese Office Action corresponding to JP Patent No. 2018-525552, pp. 1-3, dated May 29, 2019.
International Search Report arid Written Opinion corresponding to PCT/US2019/024366, pp. 1-15, dated Jul. 4, 2019.
Korean Office Action corresponding to Korean Patent Application No. 10-2018-7013967, pp. 1-6, dated Jun. 24, 2019.
International Search Report and Written Opinion corresponding to PCT/US2019/018766, pp. 1-16, dated May 22, 2019.
Japanese Office Action corresponding to JP Patent No. 2017-553990, pp. 1-3, dated Jun. 18, 2019.
Japanese Office Action corresponding to JP Patent No. 2018-525559, pp. 1-6, dated Apr. 16, 2019.
Kawai: "Fabrication of Superconducting Quantum Interference Device Magnetometers on a Glass Epoxy Polyimide Resin Substrate with Copper Terminals," Physics Procedia, NL, 2012, vol. 36, pp. 262-267, URL, http://dx.doi.org/10.1016/j.phpro.2012.06.157 (the well-known art referred to).
Iversen A Ed—institute of Electrical and Electronics Engineers: "Next Generation Power Electronics for Space and Aircraft. / Part II-Packaging", Aerospace Power Systems. Boston, Aug. 4-9, 1991; [Proceedings of the Intersociety Energy Conversion Engineering Conference], New Your, IEEE< US, vol. 1, Aug. 4 1001 (Aug. 4, 1991), pp. 177-182, XP000280446, ISBN: 978-0-89448-163-5, p. 179, col. 2 p. 181, col. 1-2, figures 6-8.
International Search Report and Written Opinion in PCT/US2019/024857 dated Jul. 22, 2019.

* cited by examiner

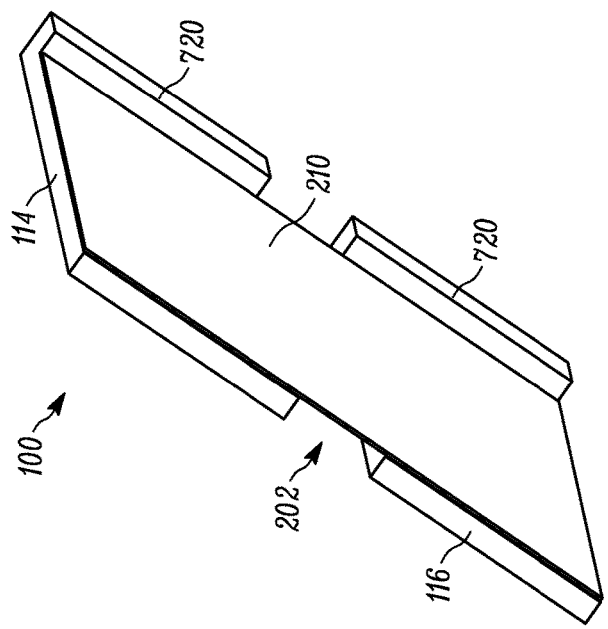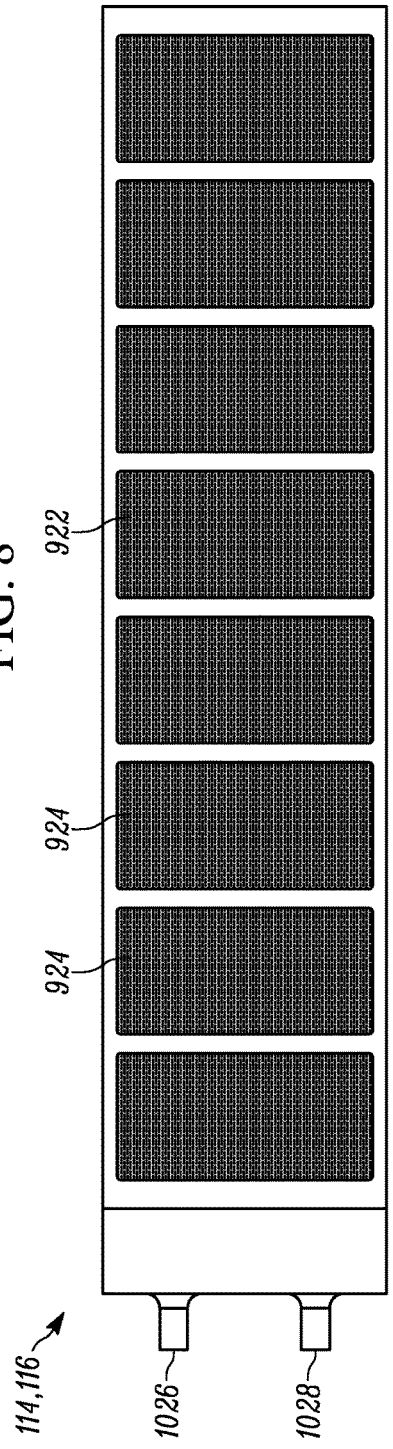

IMMERSION COOLING TEMPERATURE CONTROL METHOD, SYSTEM, AND APPARATUS

TECHNICAL FIELD

This disclosure relates to a temperature control method, system, and apparatus and, more particularly, to an apparatus, system, and method for providing immersion cooling in a circuit card environment.

BACKGROUND

A circuit card is the current state of the art for building assemblies of electronic devices including a plurality of integrated circuits ("chips"). These assemblies can be separated into multiple types: organic multilayer laminated printed wire board (PWB), low temperature co-fired ceramic (LTCC), and high temperature co-fired ceramic (HTCC). Using each of these technologies, circuit card assemblies have been fabricated.

In a superconducting supercomputer, many of the operating processing integrated circuits ("chips") are cooled to about 4K, but certain of the memory chips instead have a much warmer operating temperature of about 77K. Providing cooling at 4K is a costly activity, so every effort is made in superconducting supercomputer design to reduce the thermal parasitic load. This includes placing the assembly in vacuum (no convection), use of coatings and multilayer insulation to reduce radiation, and limiting the conductive thermal load between the "hot side" and "cool side" of the entire assembly.

For large scale applications, the state of the art currently solves the problem of achieving the desired operating temperatures for a superconducting supercomputer while avoiding thermal parasitic load by using dewars for each of the cryogenic temperatures. A 4K dewar is maintained with liquid helium and a 77K dewar uses liquid nitrogen. Signals between the two temperature sides are completed by cabling. This solution requires cables that are long from a digital perspective, which results in significant latency between the 4K and 77K regions and would require more parts in the 4K stage, such as, but not limited to, amplifiers to compensate for the loss in the longer signal path. These additional parts consume significant power and make certain designs of superconducting supercomputers infeasible.

In small scale applications, a cryocooler can be used for both temperatures. The intermediate stage of the cryocooler provides a 77K platform while the final stage of the cryocooler provides a 4K stage. Connections between the two zones are completed by cabling. While this brings the two temperatures sides closer together, this approach is not scalable to large applications.

SUMMARY

In an embodiment, an apparatus for providing immersion cooling in a circuit card environment is described. The apparatus comprises a circuit card including first and second longitudinally spaced circuit card subassemblies, connected together into a single circuit card oriented substantially in a lateral-longitudinal plane. The first and second circuit card subassemblies are connected together by a laterally extending card connector oriented in a parallel lateral-longitudinal plane to the first and second circuit card subassemblies. The first and second circuit card subassemblies have first and second operating temperatures, respectively. The first and second operating temperatures are different from one another. A thermal energy transfer device is operatively connected to an area of the circuit card correlated with a selected one of the first and second circuit card subassemblies. The thermal energy transfer device at least partially induces the respective one of the first and second operating temperatures to the selected circuit card subassembly. The thermal energy transfer device transversely overlies at least a supermajority of the selected circuit card subassembly and is laterally spaced from the other circuit card subassembly.

In an embodiment, a method of providing immersion cooling in a circuit card environment is provided. An apparatus is provided, including first and second longitudinally spaced circuit card subassemblies connected together into a single circuit card oriented substantially in a lateral-longitudinal plane. The first and second circuit card subassemblies are connected together by a laterally extending card connector oriented in a parallel lateral-longitudinal plane to the first and second circuit card subassemblies. A thermal energy transfer device transversely overlies at least a supermajority of a selected one of the first and second circuit card subassemblies and is laterally spaced from an other circuit card subassembly. The first circuit card subassembly is configured for operation at a first operating temperature. The second circuit card subassembly is configured for operation at a second operating temperature which is different from the first operating temperature. The thermal energy transfer device is operatively connected to the selected one of the first and second circuit card subassemblies. The respective one of the first and second operating temperatures is induced to the selected circuit card subassembly at least partially with the thermal energy transfer device.

In an embodiment, a system for providing immersion cooling in a circuit card environment is described. The system includes a plurality of apparatuses. Each apparatus comprises two longitudinally adjacent circuit card subassemblies maintained in close spatial proximity to each other on a single circuit card. The first and second circuit card subassemblies have first and second operating temperatures, respectively. The first and second operating temperatures are different from one another, with low thermal parasitic heat transfer between the two circuit card subassemblies due to the presence of circulating coolant-type first and second thermal energy transfer devices transversely overlying an area of the circuit card correlated with a respective one of the first and second circuit card subassemblies. The first and second thermal energy transfer devices at least partially induce the respective one of the first and second operating temperatures to the respective first and second circuit card subassemblies. A housing substantially surrounds the plurality of apparatuses in a transverse-longitudinal plane. A first cooling fluid manifold selectively introduces a first cooling fluid into, and selectively removes the first cooling fluid from, the first thermal energy transfer device. A second cooling fluid manifold selectively introduces a second cooling fluid into, and selectively removes the second cooling fluid from, the second thermal energy transfer device.

BRIEF DESCRIPTION OF THE DRAWINGS

For a better understanding, reference may be made to the accompanying drawings, in which:

FIG. 8 is a rear perspective view of the aspect of FIG. 1;

FIG. 9 is a rear view of another component of the aspect of FIG. 1;

DESCRIPTION OF ASPECTS OF THE DISCLOSURE

This technology comprises, consists of, or consists essentially of the following features, in any combination.

Figure 1:
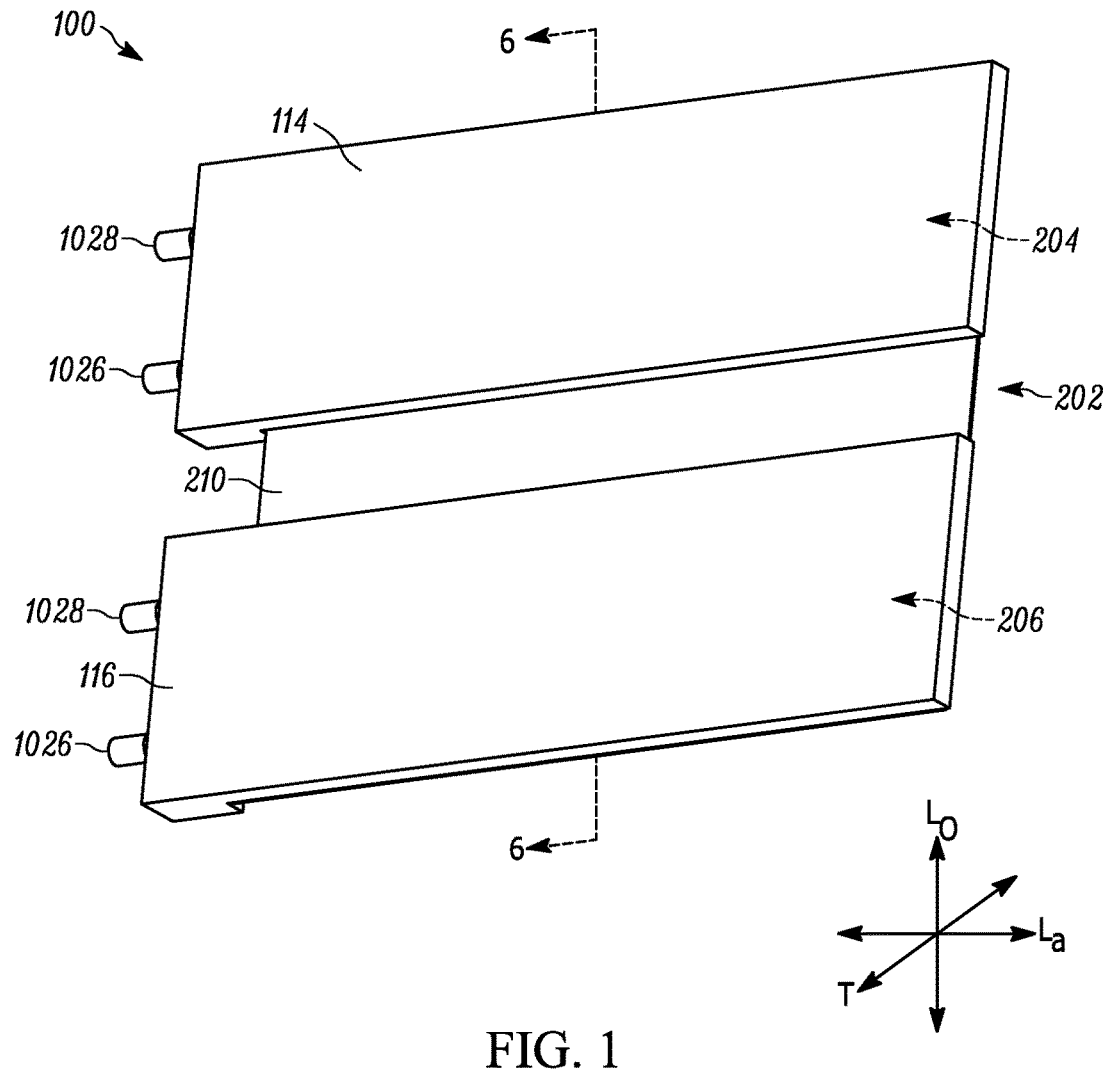
FIG. 1 is a front perspective view of one aspect of the invention.
Figure 2:
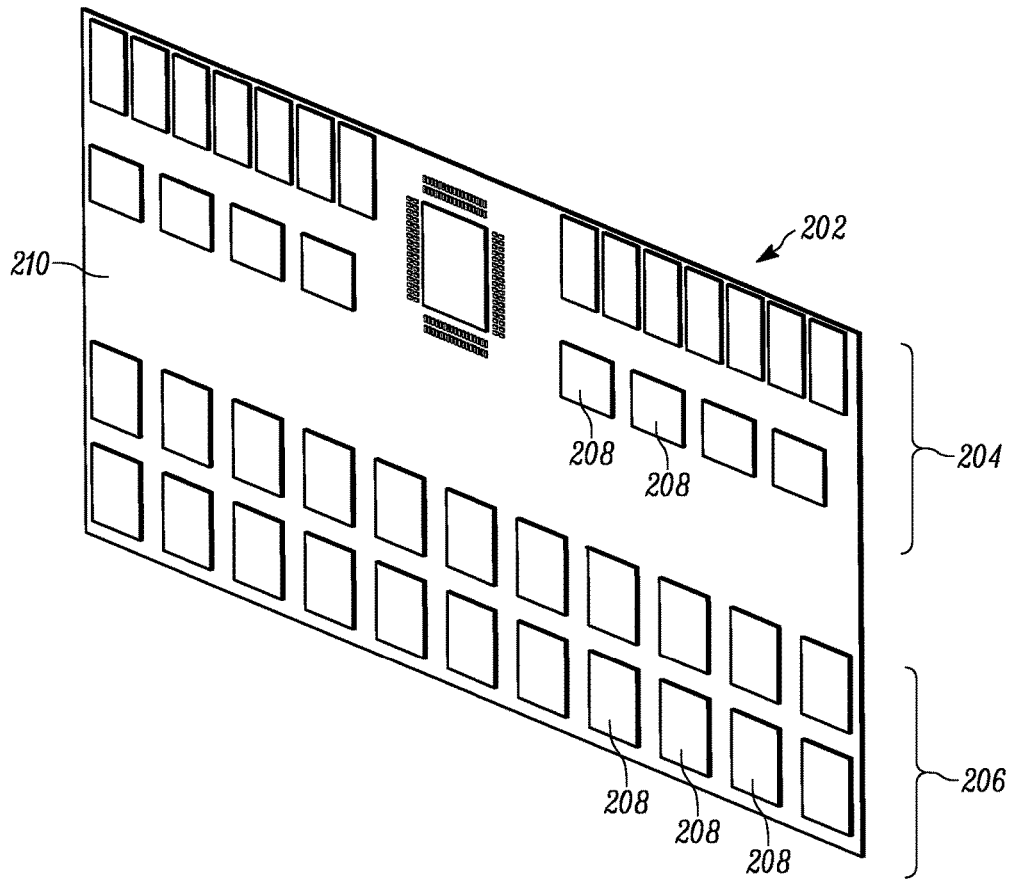
FIG. 2 is a perspective front view of another component of the aspect of FIG. 1.

FIG. 1 depicts an apparatus 100 for providing immersion cooling in a circuit card environment. A circuit card 202 includes first and second longitudinally spaced circuit card subassemblies 204 and 206, respectively, connected together into a single, substantially planar circuit card 202 oriented substantially in a lateral-longitudinal plane. The circuit card subassemblies 204 and 206 could comprise, as in the example shown in FIG. 2, two longitudinally spaced groups of IC chips 208 mounted on a single backing substrate 210.

Stated differently, two longitudinally adjacent first and second circuit card subassemblies 204 and 206 can be maintained (via their inclusion in the apparatus 100) in close spatial proximity to each other, each at a different temperature, with low thermal parasitic heat transfer between first and second circuit card subassemblies 204 and 206 due to at least one of the cooling structures described herein and the presence of a portion of the backing substrate 210 longitudinally between the first and second circuit card subassemblies 204 and 206.

Figure 3:
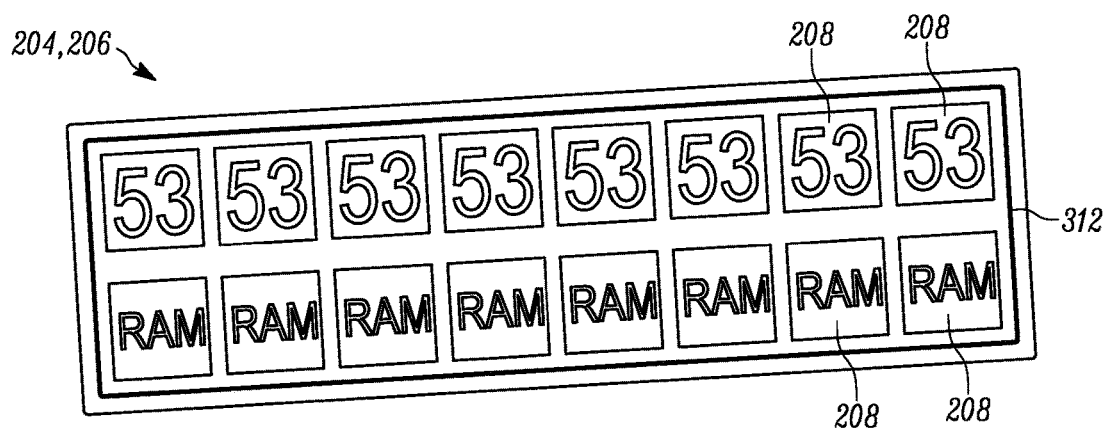
FIG. 3 is a front view of a component of the aspect of FIG. 1.

Additionally or alternatively, one or both of the first and second circuit card subassemblies 204 and 206 (either of which could have the structure depicted in FIG. 3) could comprise at least one IC chip 208 mounted on a subassembly substrate 312, as shown in FIG. 3. The subassembly substrate 312 (before or after the IC chips 208 are mounted thereon) may then be, in turn, mounted on a backing substrate 210 to achieve the desired longitudinal spacing for the first and second circuit card subassemblies 204 and 206. This "modular" construction (using subassembly substrates 312) is shown in at least FIGS. 4 and 6, and will be presumed throughout the rest of this discussion, for simplicity. Here, the backing substrate 210 will be considered to define one suitable lateral-longitudinal plane (e.g., one which is somewhat coincident with the plane of the page in FIG. 1, other than as tilted to allow for the perspective view of that Figure).

One example of a suitable circuit card 202 is provided in U.S. Pat. No. 9,648,749, issued 9 May 2017 and entitled "CIRCUIT CARD ASSEMBLY AND METHOD OF PROVIDING SAME", incorporated herein by reference in its entirety. The presence of the circuit card 202, or portions thereof, may help to restrict at least one of magnetic, thermal, and radiation transmission longitudinally between the IC chips 208 of the first and second circuit card subassemblies 204 and 206. For example, the backing substrate 210 could act in a heat shielding and electro-magnetic interference ("EMI") shielding capacity.

In other words, the first and second circuit card subassemblies 204 and 206 may be connected together by a laterally extending card connector (shown and described herein as the backing substrate 210 and/or the subassembly substrate 312) oriented in a parallel lateral-longitudinal plane to the first and second circuit card subassemblies 204 and 206. As in the arrangement of at least FIGS. 4 and 6, each circuit card subassembly 204 and 205 may include a plurality of IC chips 208 extending transversely from a subassembly substrate 312. Each subassembly substrate 312 is transversely mounted on the card connector (here, backing substrate 210). The transverse direction is substantially into and out of the plane of the paper in FIG. 1. The card connector (e.g., the backing substrate 210) has a surface area larger than the combined surface area of the subassembly substrates 312 of the first and second circuit card subassemblies 204 and 206. Accordingly, the first and second circuit card subassemblies 204 and 206 may be spaced longitudinally apart, with a longitudinally intervening portion of the card connector, with the assistance of this disparity in relative surface areas. The card connector may be less thermally conductive than either of the first and second circuit card subassemblies 204 and 206, which may assist in preventing parasitic heat transfer between the first and second circuit card subassemblies 204 and 206 in some use environments.

The IC chips 208 of a single circuit card 202 may have different temperature requirements. For example, the longitudinally topmost (in the orientation of the Figures) array of IC chips 208 (e.g., those on the first circuit card subassembly 204) could have a desired operating temperature in the range of about 2-6K, such as about 4K. Similarly, the longitudinally bottommost (in the orientation of the Figures) array of IC chips 208 (e.g., those on the second circuit card subassembly 206) could have a desired operating temperature in the range of about 75-79K, such as about 77K. As described below, the apparatus 100 can help provide a desired temperature-differential environment for the first and second circuit card subassemblies 204 and 206, and the backing substrate 210 can assist with thermal efficiency by blocking, among other energies, thermal energy transfer longitudinally between the first and second circuit card subassemblies 204 and 206. Having greater physical separation between the first and second first and second circuit card subassemblies 204 and 206 increases the thermal isolation; however, it also increases the signal loss and latency. A balance should be struck, by one of ordinary skill in the art, between acceptable signal loss/latency and thermal isolation to determine the optimal separation for a particular use environment.

The first and second circuit card subassemblies 204 and 206, as previously mentioned, may have first and second operating temperatures, respectively. The first and second operating temperatures are different from one another. A thermal energy transfer device, which will be discussed at length below, is operatively connected to an area of the circuit card 202 correlated with a selected one of the first and second circuit card subassemblies 204 and 206. Each thermal energy transfer device at least partially induces the respective, or appropriate, one of the first and second operating temperatures to the selected circuit card subassembly 204 or 206 with which that thermal energy transfer device is associated. The thermal energy transfer device transversely overlies at least a supermajority of the selected circuit card subassembly 204 or 206 and is laterally spaced from the other circuit card subassembly 206 or 204, as depicted in the Figures. There may be one or more thermal energy transfer devices provided to each apparatus 100, as desired. To assist with reducing undesirable thermal flows, the circuit card 202 and the thermal energy transfer device(s) 114 and/or 116 may be collectively contained in a vacuum ambient environment.

With reference back to FIG. 1, the thermal energy transfer device may be a first thermal energy transfer device 114. The apparatus 100 may also include a second thermal energy transfer device 116 operatively connected to an area of the circuit card 202 correlated with the other one of the first and second circuit card subassemblies 204 and 206 (i.e., not the selected one of the first and second circuit card subassemblies 204 and 206 with which the first thermal energy transfer device 114 is correlated). The second thermal energy transfer device 116 may be provided for at least partially inducing the respective, and appropriate, one of the first and second operating temperatures to the other circuit card subassembly 206 or 204. The second thermal energy transfer device 116 transversely overlies at least a supermajority of the other circuit card subassembly 206 or 204 and is laterally spaced from the selected circuit card subassembly 204 or 206.

Figure 4:
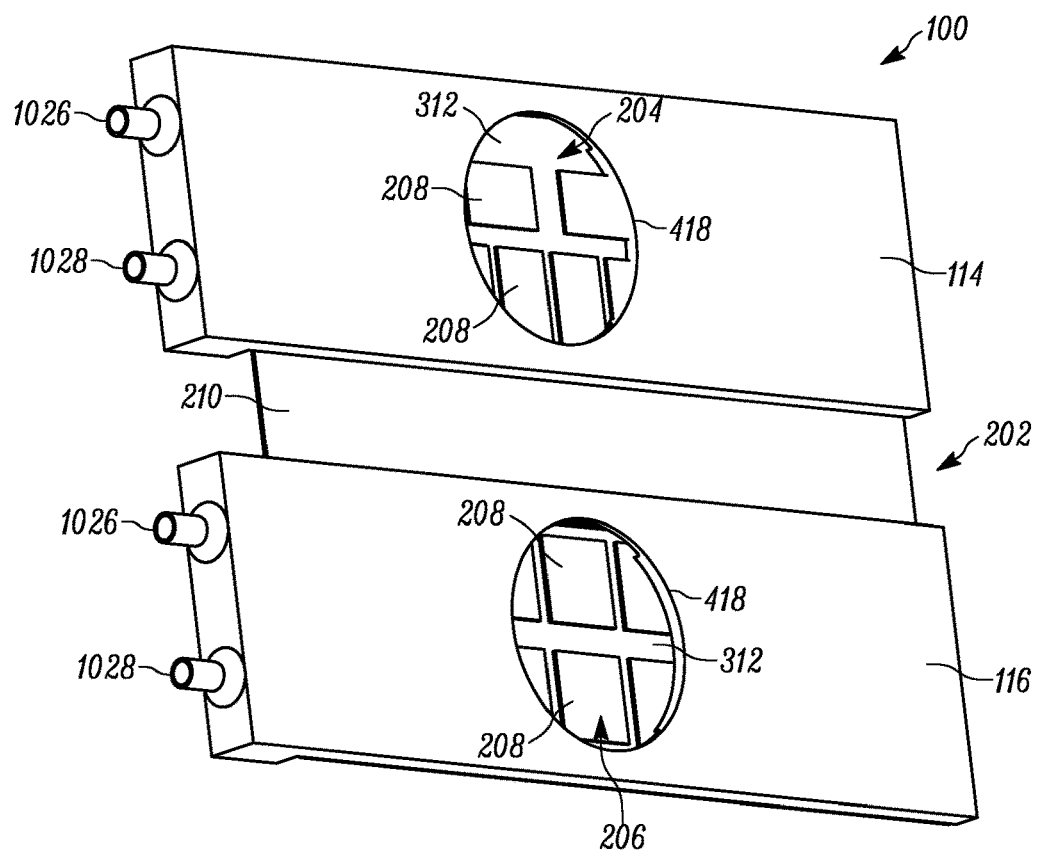
FIG. 4 is a front perspective partial cutaway view of the aspect of FIG. 1.
Figure 5:
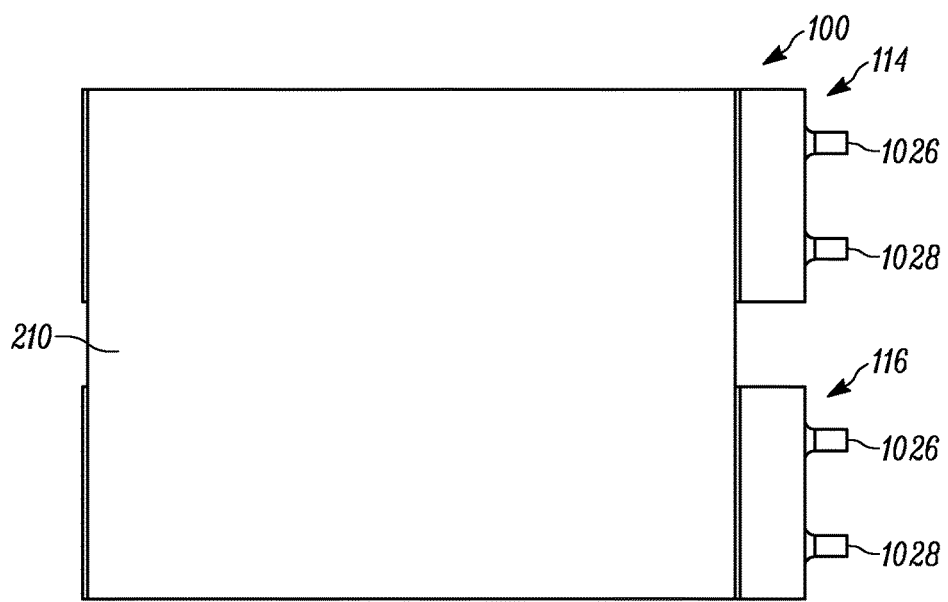
FIG. 5 is a rear view of the aspect of FIG. 1.
Figure 6:
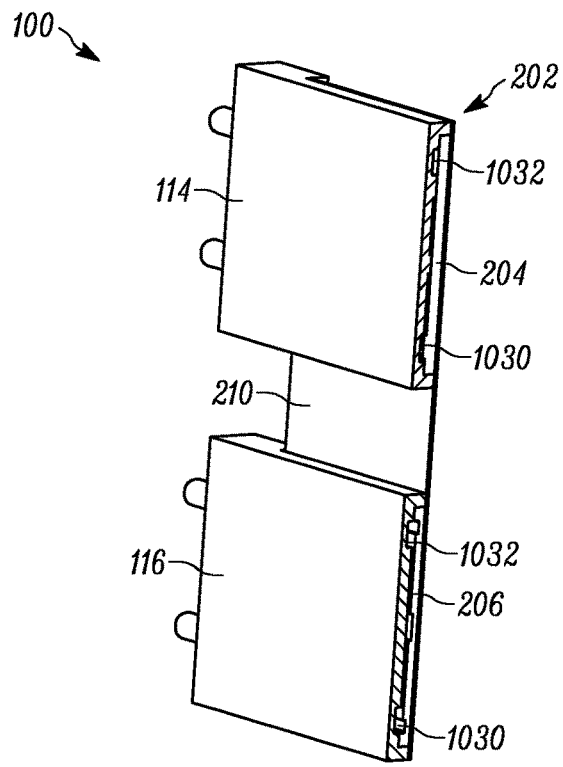
FIG. 6 is a sectional view taken along line 6-6 of FIG. 1.
Figure 7:
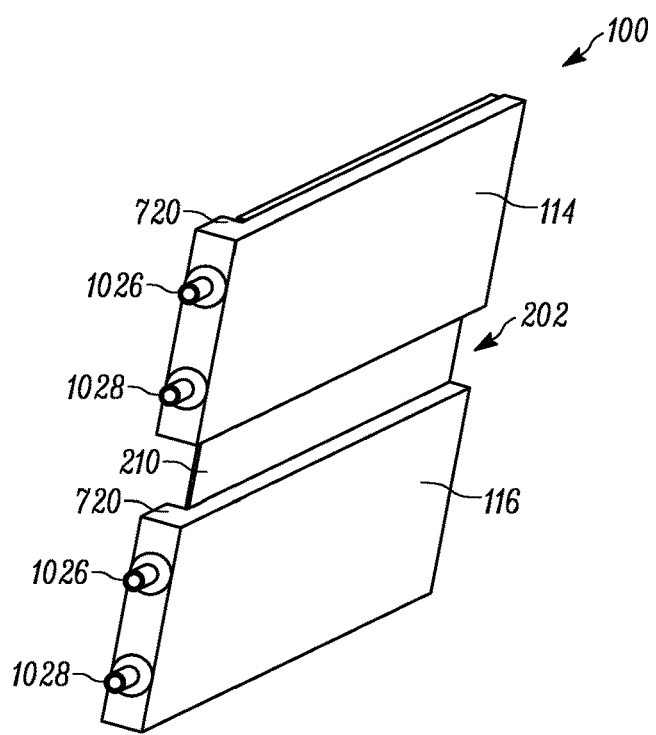
FIG. 7 is a side perspective view of the aspect of FIG. 1.

The thermal energy transfer device(s) 114 and/or 116 may be in direct thermally conductive contact with at least a portion of the selected circuit card subassembly 204 and/or 206 as shown in FIG. 6, in order to assist with heat transfer between these two structures. In some use environments, the thermal energy transfer device(s) 114 and/or 116 may be a circulating-coolant heat sink; this is the arrangement shown and described herein. The first and second thermal energy transfer devices 114 and 116 are shown in FIG. 4 as including a transparent portion or "window" 418 in a front surface thereof, to allow direct viewing of the first and second circuit card subassemblies 204 and 206 transversely underneath. One of ordinary skill in the art could readily configure the apparatus 100 for use with a window 418, as desired for a particular use environment. However, this window 418 could be omitted as desired, and the below description will presume that no window is present.

FIGS. 1 and 5-8 show an assembled apparatus 100. The first and second thermal energy transfer devices 114 and 116 are placed into thermally significant proximity with their respective first and second circuit card subassemblies 204 and 206. "Thermally significant proximity" is used herein to indicate a degree of physical closeness between the "proximate" structures which facilitates a desired direction, type, and amount of heat transfer. For example, "thermally significant proximity" includes, but is not limited to, one or more of direct contact for thermal conduction and a spaced relationship for thermal convection and/or radiation.

The relationship between the first and second thermal energy transfer devices 114 and 116 and their respective first and second circuit card subassemblies 204 and 206 may be established and maintained in any desired manner and with any suitable assistance including, but not limited to, one or more of frictional fit, adhesives, mechanical fastener(s) or other attachment structures, gravity, magnetics, soldering/welding, or the like. The first and second thermal energy transfer devices 114 and 116 and their respective first and second circuit card subassemblies 204 and 206 could instead be simply held in the desired thermally significant proximity by an external frame or jig. One of ordinary skill in the art will be able to produce a suitable apparatus 100 according to aspects of the present invention for a particular use environment.

The thermal energy transfer device(s) 114 and 116 can have any desired form factor or configuration. For example, when the first and second circuit card subassemblies 204 and 206 and/or the backing substrate 210 are planar, the thermal energy transfer device(s) 114 and 116 may have a substantially planar or flat surface (e.g., an "underside") which is placed into thermally significant proximity to those structures. With specific reference to FIGS. 7-8, the thermal energy transfer device(s) 114 and 116 may include a transversely extending thermal lip 720 which is located at least partially in a same lateral-longitudinal plane as the circuit card 202. That is, at least a portion f the thermal lip 720 is located laterally and/or longitudinally beside the circuit card 202, such that the thermal lip 720 "hangs" past the circuit card 202 in relation to the remainder of the thermal energy transfer device(s) 114 and 116, as shown in the Figures. This thermal lip 720 could be a simple planar extension substantially perpendicular to a remaining portion of the thermal energy transfer device(s) 114 and 116, as shown in the Figures. This arrangement could be used simply for orienting and registering the position of the thermal energy transfer device(s) 114 and 116 with respect to the circuit card 202, and preventing sliding contact between these two structures. The thermal lip 720 could instead form at least a portion of a substantially "C"-shaped or hook-shaped structure which wraps around an edge of the circuit card 202, for similar orientation purposes and/or to "snap" or "clip" the thermal energy transfer device(s) to the circuit card 202.

Figure 10:
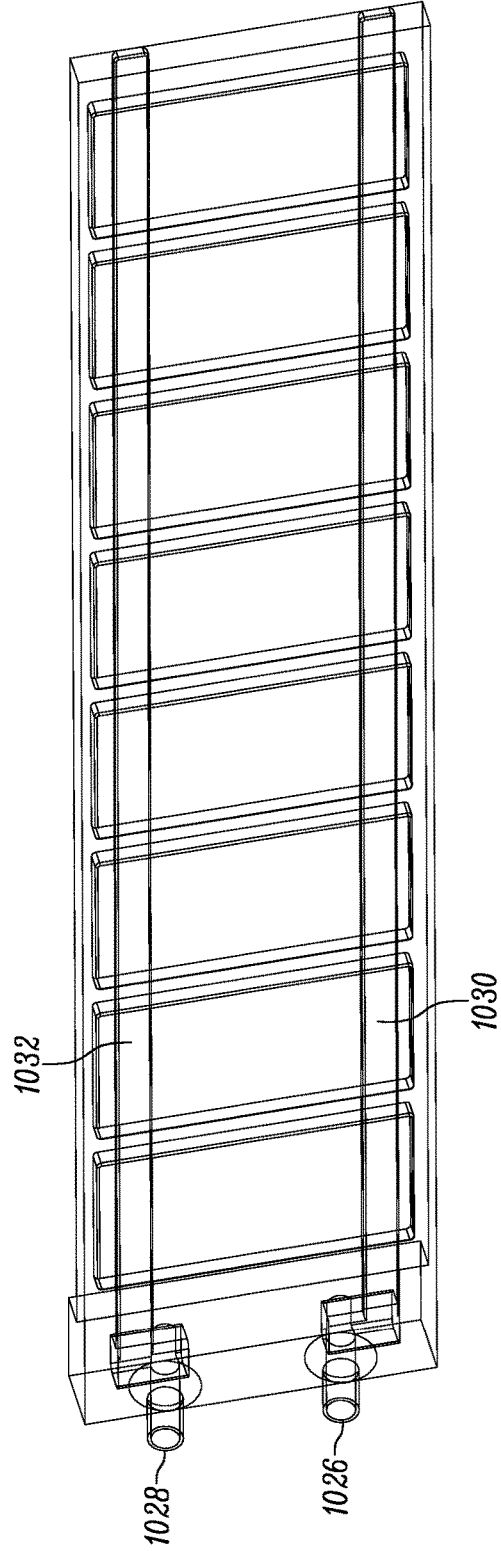
FIG. 10 is a partial rear view of the component of FIG. 9.
Figure 11:
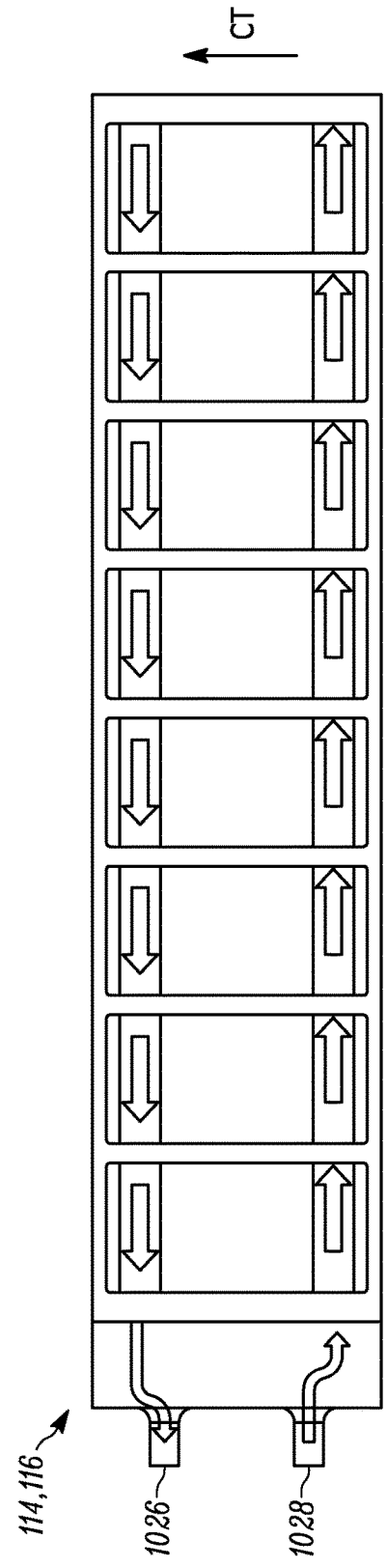
FIG. 11 is a flow diagram associated with the component of FIG. 9.

An example thermal energy transfer device 114 and/or 116 is shown detached from the remainder of the apparatus 100 in FIGS. 9-11. FIG. 9 is a rear view of the underside 922 of the thermal energy transfer device 114 and/or 116. This underside 922 is the surface of the thermal energy transfer device 114 and/or 116 that is in thermally significant proximity to the first and/or second circuit card subassemblies 204 and 206. As shown, the underside 922 could include one or more thermal pads 924 to assist with heat transfer between the thermal energy transfer device 114 and/or 116 and the circuit card 202. These thermal pads 924, when present, may each be correlated with the position and/or footprint of one or more IC chips 208, in order to increase heat transfer directly with the corresponding IC chips 208. The thermal pads 924 could also or instead have a resilient or cushioning aspect which reduces harmful contact between the IC chips 208 and the thermal energy transfer device 114 and/or 116.

FIG. 10 is a phantom view of the thermal energy transfer device 114 and/or 116, showing the structures therein. The thermal energy transfer device 114 and/or 116 shown in the Figures includes a coolant liquid supply fitting 1026 and a coolant vapor return fitting 1028. The coolant liquid supply fitting 1026 and coolant vapor return fitting 1028 can be attached in any desired manner to, respectively, the supply (e.g., liquid supply) and return (e.g., vapor return) lines from a source of fluid coolant (e.g., a Dewar flask). It is contemplated that, when the first and second circuit card subassemblies 204 and 206 have different operating temperatures (e.g., 4K and 77K), different coolants could be supplied to their respective thermal energy transfer devices 114 and 116.

The thermal energy transfer device 114 and/or 116 also includes an internal supply channel, which may be an internal liquid flow channel 1030 in fluid connection with the coolant liquid supply fitting 1026 and an internal return channel, which may be an internal vapor flow channel 1032 in fluid connection with the coolant vapor return fitting 1028. (While "liquid" and "vapor" are used here to indicate the majority of the fluid passing through these channels, it should be understood that the "liquid" channel could also include a minority proportion of vapor, and vice versa). The internal liquid flow channel 1030 and internal vapor flow channel 1032 are in mutual fluid communication for transfer of at least one of liquid and vapor coolant across at least a portion of a circuit card subassembly 204 and/or 206 in a coolant transfer direction CT substantially within a lateral-longitudinal plane, as shown in FIG. 11. That is, as shown by the flow arrows in FIG. 11, the coolant, which may be a liquid coolant, is pumped into the internal supply channel (here, internal liquid flow channel 1030) via the coolant liquid supply fitting 1026. The coolant flows through the interior of the thermal energy transfer device 114 and/or 116 and, as it flows, is at least partially sublimated into vapor coolant, which rises in the coolant transfer direction past the IC chips 208 to "wash" past the chips and thereby remove heat therefrom. (Some or all of the vapor coolant could become present within any area or portion of an interior of the thermal energy transfer device 114 and/or 116; for example nucleate boiling could occur during the cooling process.) The vapor coolant, along with any portion of the coolant that remains liquid, is then routed through the internal return channel (here, in a "backward" direction from the supply direction through internal vapor flow channel 1032) for removal from the thermal energy transfer device 114 and/or 116 through the coolant vapor return fitting 1028. The coolant is urged through the thermal energy transfer device 114 and/or 116 under negative pressure from the return direction, and/or under positive pressure from the supply direction. It is contemplated that, as previously mentioned, at least a portion of the coolant could remain liquid during this cycle through the thermal energy transfer device 114 and/or 116.

Figure 12:
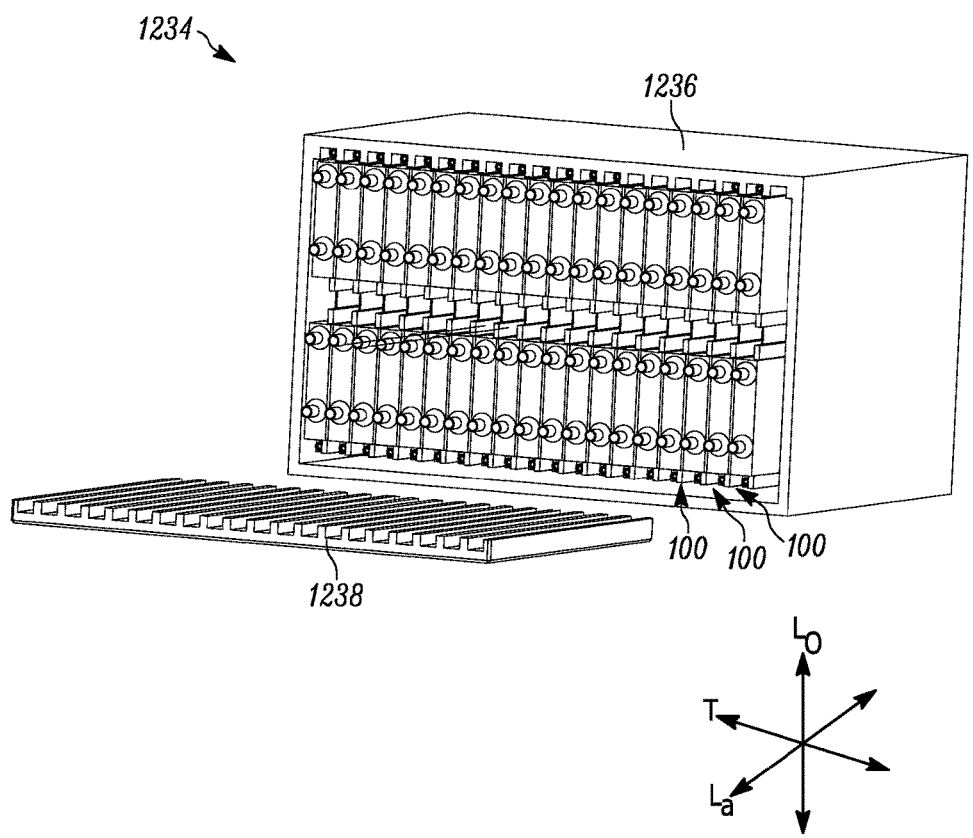
FIG. 12 is a side perspective view of a system including the apparatus of FIG. 1.
Figure 13:
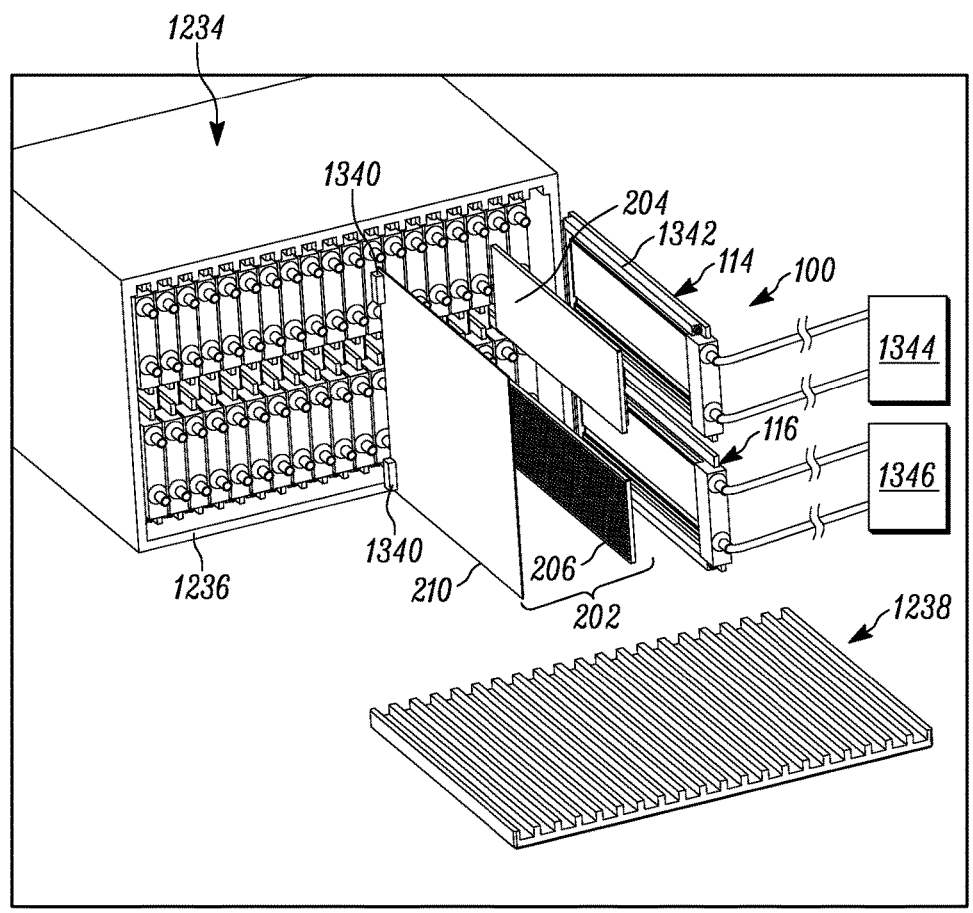
FIG. 13 is an exploded side perspective view of the system of FIG. 12.
Figure 14:
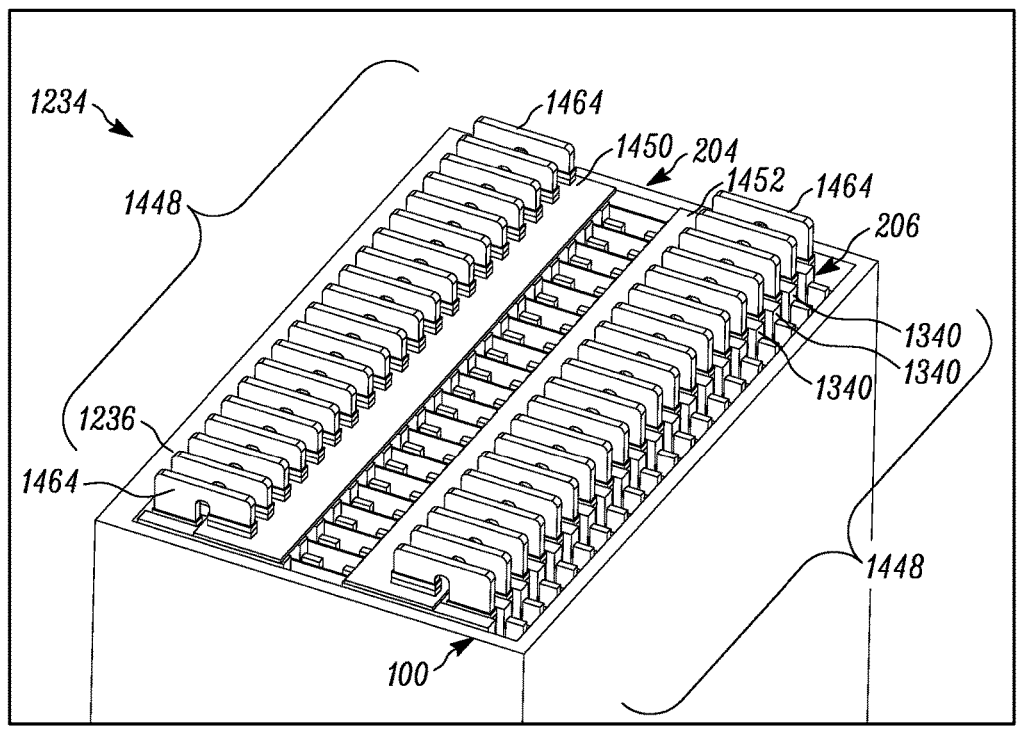
FIG. 14 is a backside perspective view of the system of FIG. 12.

FIGS. 12-14 depict a system 1234 for providing immersion cooling in a circuit card 202 environment. The system 1234 includes a plurality of apparatuses 100, which will be shown and described herein as being the type shown in FIGS. 1-11. The apparatuses 100 are "stacked" close to each other in the transverse direction, and may be in contact with one or more adjacent apparatuses 100.

As shown in FIG. 12, a housing 1236 substantially surrounds the plurality of apparatuses 100 in a transverse-longitudinal plane. That is, the housing is located in front of, behind, and across the top and bottom of at least a portion of each apparatus 100, with the sides of each apparatus 100 being exposed from the housing 1236 to permit cooling fluid, electronic/signal, and/or any other type of suitable connections to an outside agent to be made.

The housing 1236 could include one or more side-caps (not shown) which could include any desired fluid flow and/or electrical communications apertures or fittings as desired. When present, such side-caps—which may be as simple as plates across the open sides of the housing 1236—could assist with containing the apparatuses 100 for any desired reason, including protection from ambient conditions. The side-caps and housing 1236 may be particularly useful when the circuit card 202 and the thermal energy transfer device(s) 114 and 116 are collectively contained in a vacuum ambient environment, which could be at least partially facilitated by the housing 1236 and/or side-caps. Alternatively, it is contemplated that the entire system 1234 could be located within another enclosure, which itself provides any desired vacuum ambient environment to the apparatuses 100.

A spacing jig 1238 could be provided to assist with slotting the apparatuses 100 into the housing 1236, particularly if such installation is done via a lateral sliding motion. The spacing jig 1238, when present, may be removed from the system 1234 once the apparatuses 100 have been installed into the housing, 1236, or, in some use environments, could remain in place during use of the system 1234.

FIG. 13 is a partially exploded view of the system 1234, with one apparatus 100 shown removed and exploded into its component parts. One or more blocks 1340 could be provided to assist with providing mechanical spacing and/or damping, electrical connections, and/or a thermal path within the system 1234. For example, the blocks 1340 shown in FIG. 13 could serve concurrently as connectors for cables running between two or more of the first and second circuit card subassemblies 204 and 206 and at least one backplane (as described below). Any structure used as a block 1340 or physical connector within the apparatus could serve as a low conductivity support, and could be liquid crystal polymer, Kevlar, or any other low conductivity material or technique.

A rack frame, or wedgelock, 1342 can be provided to each apparatus 100 to assist with mounting that apparatus 100 within the housing 1236 and/or with damping vibrations between apparatuses 100 and/or the housing 1236. FIG. 13 also schematically depicts a first cooling fluid manifold 1344 for selectively introducing a first cooling fluid into, and selectively removing the first cooling fluid from, the first thermal energy transfer device 114. A second cooling fluid manifold 1346, also shown schematically in FIG. 13, may be provided for selectively introducing a second cooling fluid into, and selectively removing the second cooling fluid from, the second thermal energy transfer device 116. One of ordinary skill in the cryogenics arts will be able to provide suitable cooling fluid flow paths, supplies, and piping for a particular use environment of aspects of the present invention.

Turning now to FIG. 14, the backplane side of the system 1234 is shown; this is the side that is hidden from view on the rear of the depictions in FIGS. 12-13. The view of FIG. 14 shows how the blocks 1240 of the first or second circuit card subassemblies 204 or 206 can be employed to facilitate electrical communication via a cabling envelope 1448 which itself is in connection with a respective first or second backplane 1450 or 1452. The first and/or second backplanes 1450 and 1452 may also facilitate connection of multiple systems 1234 together, as desired. Connectors 1464 could be provided to electrically attach the various portions of the first and/or second circuit card subassemblies 204 or 206 and the first and/or second backplanes 1450 and 1452 together in any desired combination for transmission of power, data, electrical signals, or for any other interconnection purpose, one-way or both ways.

Figure 15:
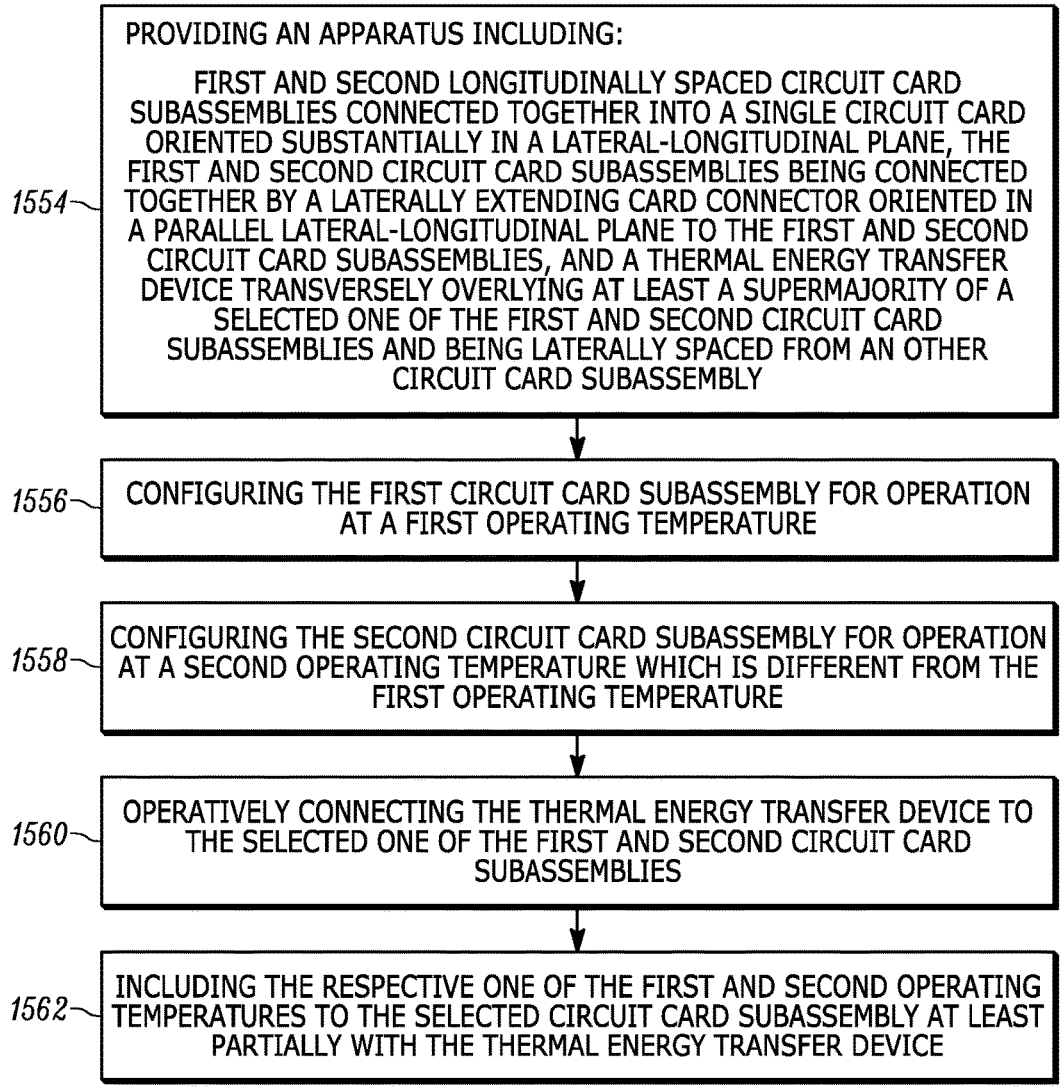
FIG. 15 is a flowchart of an example method including the aspect of FIG. 1.

FIG. 15 is a flowchart summarizing an example method of providing immersion cooling in a circuit card 202 environment using an apparatus 100 and/or a system 1234 as previously discussed. In first action block 1554 of FIG. 15, an apparatus 100 is provided. In second action block 1556 of FIG. 15, the first circuit card subassembly 204 is configured for operation at a first operating temperature (e.g., 77K). In third action block 1558, the second circuit card subassembly 206 is configured for operation at a second operating temperature (e.g., 4K) which is different from the first operating temperature. For heat convection reasons, the cooler circuit card subassembly 204 or 206 will normally be located above the warmer circuit card subassembly 204 or 206, when the apparatus 100 is placed in a substantially vertical use position.

In fourth action block 1560, the thermal energy transfer device (here, first thermal energy transfer device 114) is operatively connected to the selected one of the first and second circuit card subassemblies 204 or 206. Then, in fifth action block 1562, the respective one of the first and second operating temperatures is induced to the selected circuit card subassembly 204 or 206 at least partially with the (first) thermal energy transfer device 114. The method of FIG. 15 can be carried out before, during, or after assembly of the apparatus 100 into a system 1234, as previously described. The method of FIG. 15 can also or instead be carried out similarly with a plurality of apparatuses 100, sequentially or concurrently.

In serial or parallel with the action of fourth action block 1560, another thermal energy transfer device (here, second thermal energy transfer device 116) can likewise be operatively connected to the other one of the first and second circuit card subassemblies 204 or 206. For clarity of the present description, the operative connections will be presumed to be made as described above with respect to FIGS. 1-14, where the first/second designations are concerned. In this "second thermal energy transfer device 116" scheme, then, the respective one of the first and second operating temperatures can be induced to the other circuit card subassembly 204 or 206 at least partially with the second thermal energy transfer device 116, analogously to the action in fifth action block 1562 with the first thermal energy transfer device 114.

The method of FIG. 15 can further include bringing the internal liquid flow channel 1030 and internal vapor flow channel 1032 into mutual fluid communication. At least one of liquid and vapor coolant can then be transferred across at least a portion of a circuit card subassembly 204 and 206, between the internal liquid flow channel 1030 and internal vapor flow channel 1032, in a coolant transfer direction CT substantially within a lateral-longitudinal plane. Therefore, through use of the apparatus 100 and/or system 1234 as shown and described herein, a temperature control scheme, such as immersion cooling, can be carried out as desired.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature may not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Though cooling is used herein as a temperature control example, one of ordinary skill in the art could providing heating using the apparatus 100 and/or system 1234, or substantially similar constructs thereto. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. An apparatus for providing immersion cooling in a circuit card environment, the apparatus comprising:
a circuit card including first and second longitudinally spaced circuit card subassemblies, connected together into a single circuit card oriented substantially in a lateral-longitudinal plane, the first and second circuit card subassemblies being connected together by a laterally extending card connector oriented in a parallel lateral-longitudinal plane to the first and second circuit card subassemblies, the first and second circuit card subassemblies having first and second operating temperatures, respectively, the first and second operating temperatures being different from one another, each circuit card subassembly including a plurality of IC chips extending transversely from a subassembly substrate, each subassembly substrate being transversely mounted on the card connector, the card connector having a surface area larger than the combined surface area of the subassembly substrates of the first and second circuit card subassemblies; and a thermal energy transfer device operatively connected to an area of the circuit card correlated with a selected one of the first and second circuit card subassemblies, the thermal energy transfer device at least partially inducing the respective one of the first and second operating temperatures to the selected circuit card subassembly, the thermal energy transfer device transversely overlying at least a supermajority of the selected circuit card subassembly and being laterally spaced from the other circuit card subassembly.

2. The apparatus of claim 1, wherein the thermal energy transfer device is a first thermal energy transfer device, and including a second thermal energy transfer device operatively connected to an area of the circuit card correlated with the other one of the first and second circuit card subassemblies, the second thermal energy transfer device at least partially inducing the respective one of the first and second operating temperatures to the other circuit card subassembly, the second thermal energy transfer device transversely overlying at least a supermajority of the other circuit card subassembly and being laterally spaced from the selected circuit card subassembly.

3. The apparatus of claim 1, wherein the thermal energy transfer device is a circulating-coolant heat sink.

4. The apparatus of claim 3, wherein the thermal energy transfer device includes a coolant liquid supply fitting and a coolant vapor return fitting.

5. The apparatus of claim 4, wherein the thermal energy transfer device includes an internal liquid flow channel in fluid connection with the coolant liquid supply fitting and an internal vapor flow channel in fluid connection with the coolant vapor return fitting, the internal liquid flow channel and internal vapor flow channel being in mutual fluid communication for transfer of at least one of liquid and vapor coolant across at least a portion of a circuit card subassembly in a coolant transfer direction substantially within a lateral-longitudinal plane.

6. The apparatus of claim 1, wherein the thermal energy transfer device is in direct thermally conductive contact with at least a portion of the selected circuit card subassembly.

7. The apparatus of claim 1, wherein the circuit card and the thermal energy transfer device are collectively contained in a vacuum ambient environment.

8. The apparatus of claim 1, wherein the card connector is less thermally conductive than either of the first and second circuit card subassemblies.

9. The apparatus of claim 1, wherein the thermal energy transfer device includes a transversely extending thermal lip which is located at least partially in a same lateral-longitudinal plane as the circuit card.

10. A method of providing immersion cooling in a circuit card environment, the method comprising:

providing an apparatus including:
first and second longitudinally spaced circuit card subassemblies connected together into a single circuit card oriented substantially in a lateral-longitudinal plane, the first and second circuit card subassemblies being connected together by a laterally extending card connector oriented in a parallel lateral-longitudinal plane to the first and second circuit card subassemblies, each circuit card subassembly including a plurality of IC chips extending transversely from a subassembly substrate, each subassembly substrate being transversely mounted on the card connector, the card connector having a surface area larger than the combined surface area of the subassembly substrates of the first and second circuit card subassemblies, and a thermal energy transfer device transversely overlying at least a supermajority of a selected one of the first and second circuit card subassemblies and being laterally spaced from an other circuit card subassembly;

configuring the first circuit card subassembly for operation at a first operating temperature;

configuring the second circuit card subassembly for operation at a second operating temperature which is different from the first operating temperature;

operatively connecting the thermal energy transfer device to the selected one of the first and second circuit card subassemblies; and inducing the respective one of the first and second operating temperatures to the selected circuit card subassembly at least partially with the thermal energy transfer device.

11. The method of claim 10, wherein
providing an apparatus includes:
providing the thermal energy transfer device as a first thermal energy transfer device, and
providing a second thermal energy transfer device transversely overlying at least a supermajority of the other one of the first and second circuit card subassemblies and being laterally spaced from the selected circuit card subassembly; and
the method further includes:
operatively connecting the second thermal energy transfer device to the other one of the first and second circuit card subassemblies; and
inducing the respective one of the first and second operating temperatures to the other circuit card subassembly at least partially with the second thermal energy transfer device.

12. The method of claim 10, wherein providing an apparatus includes providing the thermal energy transfer device with a coolant liquid supply fitting and a coolant vapor return fitting.

13. The method of claim 12, wherein
providing an apparatus includes:
providing the thermal energy transfer device with an internal liquid flow channel in fluid connection with the coolant liquid supply fitting and an internal vapor flow channel in fluid connection with the coolant vapor return fitting; and
the method further includes:
bringing the internal liquid flow channel and internal vapor flow channel into mutual fluid communication; and
transferring at least one of liquid and vapor coolant across at least a portion of a circuit card subassembly, between the internal liquid flow channel and internal vapor flow channel, in a coolant transfer direction substantially within a lateral-longitudinal plane.

14. The method of claim 10, wherein providing an apparatus includes placing the thermal energy transfer device in direct thermally conductive contact with at least a portion of the selected circuit card subassembly.

15. The method of claim 10, including collectively containing the circuit card and the thermal energy transfer device in a vacuum ambient environment.

16. The method of claim 10, wherein operatively connecting the second thermal energy transfer device to the other one of the first and second circuit card subassemblies includes causing a transversely extending thermal lip of the thermal energy transfer device to be located at least partially in a same lateral-longitudinal plane as the circuit card.

17. A system for providing immersion cooling in a circuit card environment, the system comprising:

a plurality of apparatuses, each apparatus comprising
two longitudinally adjacent circuit card subassemblies maintained in close spatial proximity to each other on a single circuit card, the first and second circuit card subassemblies having first and second operating temperatures, respectively, the first and second operating temperatures being different from one another, with low thermal parasitic heat transfer between the two circuit card subassemblies due to the presence of circulating coolant-type first and second thermal energy transfer devices transversely overlying an area of the circuit card correlated with a respective one of the first and second circuit card subassemblies, the first and second thermal energy transfer devices at least partially inducing the respective one of the first and second operating temperatures to the respective first and second circuit card subassemblies;

a housing substantially surrounding the plurality of apparatuses in a transverse-longitudinal plane;

a first cooling fluid manifold selectively introducing a first cooling fluid into, and selectively removing the first cooling fluid from, the first thermal energy transfer device; and a second cooling fluid manifold selectively introducing a second cooling fluid into, and selectively removing the second cooling fluid from, the second thermal energy transfer device.

\* \* \* \* \*